(12) United States Patent
Satou

(10) Patent No.: US 7,618,881 B2
(45) Date of Patent: Nov. 17, 2009

(54) THIN-FILM TRANSISTOR AND MANUFACTURING METHOD THEREOF

(75) Inventor: Tadashi Satou, Tokyo (JP)

(73) Assignees: NEC Corporation (JP); NEC LCD Technologies, Ltd. (JP)

( * ) Notice: Subject to any disclaimer, the term of this patent is extended or adjusted under 35 U.S.C. 154(b) by 0 days.

(21) Appl. No.: 11/625,214

(22) Filed: Jan. 19, 2007

(65) Prior Publication Data

US 2007/0170526 A1 Jul. 26, 2007

(30) Foreign Application Priority Data

Jan. 23, 2006 (JP) .............................. 2006-014272

(51) Int. Cl.
*H01L 21/20* (2006.01)
(52) U.S. Cl. .................. 438/479; 257/E21.413
(58) Field of Classification Search ............ 257/213, 257/288, 347, 348, 349, 350, 351, 352, 353, 257/354, E21.412, E21.413; 438/142, 149, 438/151, 478, 479
See application file for complete search history.

(56) References Cited

U.S. PATENT DOCUMENTS 6,232,208 B1 * 5/2001 Wu et al. ..................... 438/585
2003/0100151 A1 * 5/2003 Okamoto ..................... 438/163

FOREIGN PATENT DOCUMENTS

| JP | 58-204570 | | 11/1983 |
| JP | 1-125866 | | 5/1989 |
| JP | 5-152326 | | 6/1993 |
| JP | 7-106582 | | 4/1995 |
| JP | 7-202210 | | 8/1995 |
| JP | 11-307777 | | 11/1999 |
| JP | 2002-026332 | | 1/2002 |
| JP | 2004-46054 | | 2/2004 |
| JP | 2004-336073 | * | 11/2004 |
| JP | 2004-336073 A | * | 11/2004 |

* cited by examiner

*Primary Examiner*—Sue Purvis
*Assistant Examiner*—Kevin Quinto
(74) *Attorney, Agent, or Firm*—Hayes Soloway P.C.

(57) ABSTRACT

A method for forming a thin-film transistor on an insulating substrate includes the steps of: forming a non-single-crystal semiconductor thin film on the insulating substrate; forming a gate insulating film on the non-single-crystal semiconductor thin film; forming a gate electrode including a lower gate electrode and an upper gate electrode on the gate insulating film, the lower gate electrode having a portion that is not covered by the upper gate electrode; forming a source-drain region and an LDD (lightly doped drain) region in the non-single-crystal thin film semiconductor film concurrently by introducing an impurity into the non-single-crystal semiconductor thin film through the gate electrode and the gate insulating film; and etching away an exposed portion of the lower gate electrode by using the upper gate electrode as a mask.

4 Claims, 7 Drawing Sheets

THIN-FILM TRANSISTOR AND MANUFACTURING METHOD THEREOF

BACKGROUND OF THE INVENTION

1. Field of the Invention

The present invention relates to a thin-film transistor (TFT) formed on an insulating substrate and a manufacturing method thereof and, in particular, to a thin-film transistor suitable for use in a liquid-crystal display (LCD) and a contact image sensor and to a manufacturing method thereof.

2. Description of the Related Arts

An active-matrix substrate in which an amorphous silicon TFT is provided for each pixel as a pixel transistor has been used in most LCDs in recent years. However, as the variety of applications of LCDs has increased, there is a strong demand for thinner and smaller LCDs. To meet the demand, it is becoming popular to form driving circuits with TFTs on an active-matrix substrate. It is undesirable to use an amorphous silicon thin film to form TFTs for driving circuits in terms of the operating speed and driving ability of the transistors. Therefore, there is also a demand for formation of a TFT that uses as its active layer a polysilicon thin film (i.e., polycrystalline silicon thin film), which has a higher carrier mobility than an amorphous silicon thin film.

However, one of the serious problems with polysilicon TFTs is a large leakage current. In order to avoid the problem of the large leakage current, Japanese Patent Laid-Open Application Nos. Sho-58-204570, Hei-1-125866, Hei-5-152326, Hei-7-106582 (JP, A, 58-204570; JP, A, 01-125866; JP, 05-152326; and JP, A, 07-105682) others on propose TFTs having an LDD (Lightly Doped Drain) structure in which a gate-side portion of a drain region is a lightly doped region. Hereinafter, a TFT having an LDD structure is referred to as an LDD-TFT. Japanese Patent Laid-Open Application No. Hei-7-202210 (JP, A, 07-202210) proposes an LDD-TFT having an overlapped structure in which one end of a drain region overlaps a gate electrode with a gate insulating film between them and the portion of the drain region that overlaps the gate electrode is a lightly doped region.

A number of manufacturing processes for manufacturing LDD-TFTs have been proposed. FIGS. 1A to 1E show a manufacturing process sequence by step that is disclosed in JP, A, 58-204570 given above. First, underlying insulating film 71 is formed on insulating substrate 79 such as a glass substrate, polysilicon thin film 72 is formed on underlying insulating film 71, and polysilicon thin film 72 is patterned into an island by etching, as shown in FIG. 1A. Then, underlying insulating film 71 and polysilicon thin film 72 are covered with gate insulating film 73, gate electrode 74 is formed on gate insulating film 73, photoresist film 75 is formed on gate electrode 74, and photoresist film 75 is patterned.

Then, photoresist film 75 is used as a mask to etch gate electrode 74, and photoresist film 75 is removed as shown in FIG. 1B. Photoresist film 76 is formed and photoresist film 76 is patterned in such a manner that the top and side surfaces of gate electrode 74 are covered with photoresist film 76 as shown in FIG. 1C. Then, polysilicon thin film 72 is doped with an impurity through gate insulating film 73 by using photoresist film 76 as a mask to form source-drain region 77, as shown in FIG. 1D.

Finally, photoresist film 76 is removed, polysilicon thin film 72 is further doped with the impurity through gate insulating film 73 by using gate electrode 74 as a mask to form LDD region 78. Thus, a basic structure of TFT 70 is completed. TFT 70 is a top-gate LDD-TFT because the gate electrode is provided on the side opposite to the substrate across the semiconductor layer (polysilicon thin film 72).

However, the conventional LDD-TFTs have a problem that their manufacturing process sequence involves increased numbers of processes and masks required, resulting in a decrease in the throughput. For example, to manufacture an LDD-TFT using the method described in JP, A, 58-204570 or JP, A, 07-106582, two doping processes are required. The method described in JP, A, 07-202210 which proposes an LDD-TFT having an overlapped structure requires a process for anodizing an upper gate electrode and a process for removing an anodized oxide portion.

To solve these problems with the conventional processes for manufacturing LDD-TFTs, Japanese Patent Laid-Open Application No. Hei-11-307777 (JP, A, 11-307777) discloses an LDD-TFT having an overlapped structure and capable of being manufactured with fewer processes. In this LDD-TFT, a drain region is doped with an impurity through a gate electrode that is disposed so as to overlap the drain region to form a source-drain region and an LDD region at a time in one doping process, thereby reducing the number of processes. FIG. 2 shows the overlapped LDD-TFT disclosed in JP, A, 11-307777. In the TFT 80 shown in FIG. 2, one surface of glass substrate 81 is completely covered with underlying insulating film 82. Polysilicon thin film 83 is provided on underlying insulating film 82. Polysilicon thin film 83 is covered with gate insulating film 84, on which a gate electrode is provided by patterning. The gate electrode has a two-layer structure consisting of lower gate electrode 85 provided adjacent to gate insulating film 84 and upper gate electrode 86 provided on lower gate electrode 85. Lower gate electrode 85 is larger than upper gate electrode 86. Lower gate electrode 85 is made from a microcrystalline silicon thin film and upper gate electrode 86 is made from a metal film such as tungsten silicide film. The difference between lower gate electrode (i.e., microcrystalline silicon thin film) 85 and upper gate electrode (i.e., metal film) 86 in size can be achieved by side-etching of upper gate electrode 86 in the etching process for forming the gate electrode.

The portion of polysilicon thin film 83 that is not covered by lower gate electrode 85 above gate insulting film 84 is doped with an impurity so as to become source-drain region 87. LDD region 88 having a lower impurity concentration than source-drain region 87, and abutting with source-drain region 87, is also provided in polysilicon film 83. LDD region 88 is formed in a position that lies beneath lower gate electrode 85, which is above gate insulating film 84, but does not lie beneath upper gate electrode 86. Source-drain region 87 and LDD region 88 can be formed concurrently in one doping process by ion implantation of the impurity after upper and lower gate electrodes 85, 86 are patterned into predetermined shapes. In this way, an overlapped LDD-TFT can be formed with a reduced number of processes according to the manufacturing method described in JP, A, 11-307777.

However, the overlapped LDD-TFTs have a problem that leakage current reduction, which is the intended purpose of the LDD, cannot sufficiently be achieved because a current leaks from the portion where the gate electrode and the LDD region overlap each other.

Although the overlapped LDD-TFT described in JP, A, 11-307777 can be manufactured by a simple manufacturing process, an increase in leakage current from the overlapping portion that occurs when a reverse voltage is applied is too large to be neglected. If leakage current occurs in TFTs used in an LCD, liquid-crystal elements in individual pixels cannot adequately be controlled. Therefore, reduction of leakage current in polysilicon TFTs is a critical issue that must be addressed in fabrication of LCDs.

SUMMARY OF THE INVENTION

An object of the present invention is to provide a highly reliable top-gate LDD-TFT that is capable of reducing leakage current and being manufactured at a high process throughput and a low manufacturing cost.

Another object of the present invention is to provide a manufacturing method capable of manufacturing a highly reliable top-gate LDD-TFT capable of reducing leakage current at a high throughput and a low cost.

The first object of the present invention can be achieved by a thin-film transistor including: a non-single-crystal semiconductor thin film formed on an insulating substrate; a gate insulating film formed on the non-single-crystal semiconductor thin film; a gate electrode formed on the gate insulating film and including a lower gate electrode and an upper gate electrode; and an LDD (lightly doped drain) structure including a heavily doped region and a lightly doped region formed in the non-single-crystal semiconductor thin film. In the thin-film transistor according to the present invention, the difference in impurity concentration between the lightly doped region and the heavily doped region is equivalent to the concentration of an impurity blocked by the lower gate electrode from being introduced; and the gate electrode does not exist over the lightly doped region.

In the thin-film transistor according to the present invention, the lightly doped region is typically used as an LDD region in an LDD structure and the heavily doped region is used as a source-drain region.

The fact that the difference in impurity concentration between the lightly doped region and the heavily doped region is equivalent to the concentration of an impurity blocked by the lower gate electrode means that the impurity has been introduced into the non-single-crystal semiconductor thin film through the gate insulating film and the lower gate electrode. That is, the region in the non-single-crystal semiconductor thin film above which only the gate insulating film is formed becomes the heavily doped region and the region above which both of the gate insulating film and the lower gate electrode are formed becomes the lightly doped regions. The fact that the gate electrode does not exist over the lightly doped region means that the upper gate electrode was used as a mask to etch away the exposed portion of the lower gate electrode, that is, the portion of the lower gate electrode over the lightly doped region. The absence of the gate electrode over the lightly doped region weakens the electric field formed from the gate electrode to the lightly doped region, reducing leakage current compared with the case where the gate electrode is over the lightly doped region.

The non-single-crystal semiconductor thin film may be a polysilicon thin film, for example. A polysilicon thin film has high carrier mobility and therefore is suitable for formation of an integrated circuit (IC). The non-single-crystal semiconductor thin film is not limited to a polysilicon thin film. It may be a microcrystalline silicon thin film or an amorphous silicon thin film. A microcrystalline silicon thin film is a silicon thin film consisting of a microscopic silicon crystal grains and amorphous silicon and is typically formed by plasma CVD (chemical vapor deposition). The grain size of the silicon crystal in the microcrystalline silicon thin film is for example, 50 nm or less, typically not over 10 nm.

While the gate insulating film is typically a silicon oxide film, other insulating film such as a silicon nitride or silicon oxynitride film may be used instead.

The lower gate electrode may be any conductive material that can be etched by using the upper gate electrode as a mask. For example, a microcrystalline silicon film may preferably be used.

The upper gate electrode may be a film of such metal as chromium (Cr), aluminum (Al), tungsten silicide (WSi), molybdenum (Mo), and molybdenum silicide (MoSi), or may be an alloy film such as a tungsten molybdenum (W—Mo) film.

The second object of the present invention is achieved by a method for manufacturing a thin-film transistor, including the steps of: forming a non-single-crystal semiconductor thin film on an insulating substrate; forming a gate insulating film on the non-single-crystal semiconductor thin film; forming a gate electrode including a lower gate electrode and an upper gate electrode on the gate insulating film, the lower gate electrode having a portion that is not covered by the upper gate electrode; forming a heavily doped region and a lightly doped region in the non-single-crystal semiconductor thin film concurrently by introducing an impurity into the non-single-crystal semiconductor thin film through the gate electrode and the gate insulating film; and etching away an exposed portion of the lower gate electrode by using the upper gate electrode as a mask.

The step of forming a gate electrode in the method of the present invention may include the steps of forming a conductive film consisting of multiple layers on the gate insulating film and forming the gate electrode by selectively etching the conductive film.

In another embodiment, the step of forming a gate electrode may include the steps of: forming a conductive film consisting of multiple layers on the gate insulating film; selectively forming a photoresist film on the top layer of the conductive film; forming the upper gate electrode by applying isotropic etching to the conductive film using the photoresist film as a mask and forming the lower gate electrode by applying anisotropic etching to the conductive film using the photoresist film as a mask. The isotropic etching is preferably wet etching.

According to the present invention, the lower gate electrode larger in size than the upper gate electrode is formed during gate electrode formation so that a portion of the lower gate electrode is not covered by the upper gate electrode. By forming such gate electrodes, an overlapped LDD structure capable of being activated at a low temperature can be provided by a single doping process in which an impurity is introduced through the gate insulating film and the lower gate electrode. In addition, in the overlapped LDD structure fabricated in the reduced number of processes, the exposed portion of the lower gate electrode is etched by using the upper gate electrode as a mask. As a result, an LDD-TFT with minimized leakage current can be implemented. The impurity doping method may be ion implantation, diffusion or the like.

Furthermore, when the photoresist film is commonly used as a mask for isotropic etching to the conductive film for forming the upper gate electrode and for anisotropic etching to the conductive film for forming the lower gate electrode, the need for providing a photoresist mask for each of the upper and lower gate electrode layers can be eliminated, thereby further improving the throughput and reducing the cost.

In this way, according to the present invention, the portion of the gate electrode disposed over the LDD region can be readily removed by etching the exposed portion of the lower gate electrode by using the upper gate electrode as a mask after the single doping process through the gate insulating film and the lower gate electrode, thereby providing the LDD- TFT with minimized leakage current while preventing an increase in the number of processes.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 3:
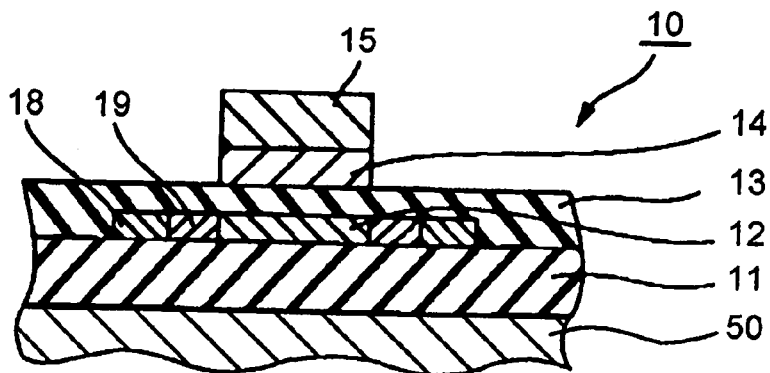
FIG. 3 is a cross-sectional view of a basic structure of a TFT according to a first embodiment of the present invention.

FIG. 3 shows a basic structure of an LDD-TFT according to a first embodiment of the present invention. TFT 10 includes insulating substrate 50 such as a low-temperature glass substrate, underlying insulating film 11 provided on one surface of insulating substrate 50, polysilicon thin film 12 provided on underlying insulating film 11 by patterning, gate insulating film 13 formed so as to cover polysilicon thin film 12 and underlying insulating film 11, and a gate electrode formed on gate insulating film 13. The gate electrode consists of two layers: lower gate electrode 14 provided adjacent to gate insulating film 13 and upper gate electrode 15 provided on lower gate electrode 14. Lower gate electrode 14 and upper gate electrode 15 have the same plan shape. That is, the gate electrode does not have a step-like shape, which would otherwise exist due to a difference between lower gate electrode 14 and upper gate electrode 15 in planar shape.

The region in polysilicon thin film 12 other than the region beneath lower gate electrode 14 on gate insulating film 13 is source-drain region 18 into which an impurity is introduced. On the region, the region near lower gate electrode 14 is LDD region 19. Source-drain region 18 and LDD region 19 are formed by doping polysilicon thin film 12 with the same impurity with different impurity concentrations. The impurity concentration in source-drain region 18 is higher than that in LDD region 19. In TFT 10 shown in FIG. 3, LDD region 19 extends to the position of the perimeter of lower gate electrode 14 but not to under lower gate electrode 14. In other words, lower gate electrode 14 and LDD region 19 do not overlap each other.

A manufacturing method of TFT 10 shown in FIG. 3 will be described below. FIGS. 4A to 4E illustrate a manufacturing process sequence of TFT 10 step by step.

Figure 4A:
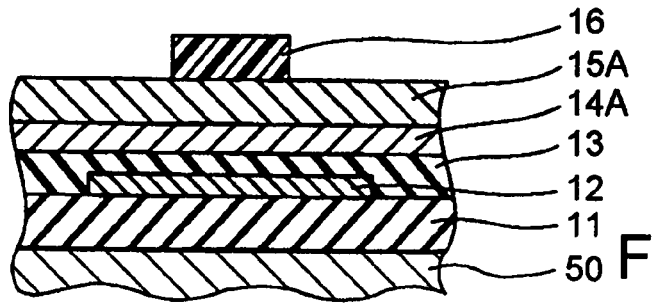
FIGS. 4A to 4E are cross-sectional views showing a sequence of manufacturing process of the TFT shown in FIG. 3.

As shown in FIG. 4A, underlying insulating film 11 is first deposited on one surface of insulating substrate 50, then a silicon thin film is deposited on the entire surface of underlying insulating film 11, and laser annealing is applied to the silicon thin film using CW (continuous wave) laser or pulse laser light to form polysilicon thin film 12. Polysilicon thin film 12 is then patterned into an island and gate insulting film 13 is deposited to cover patterned polysilicon thin film 12. Then, microcrystalline silicon thin film 14A from which a lower gate electrode will be formed is deposited on gate insulating film 13 to a thickness of 70 nm or more by using plasma CVD at a temperature of 350° C. or lower, then metal film 15A from which an upper gate electrode will be formed is deposited on microcrystalline silicon thin film 14A, and photoresist film 16 is selectively formed on metal film 15A.

Figure 4B:
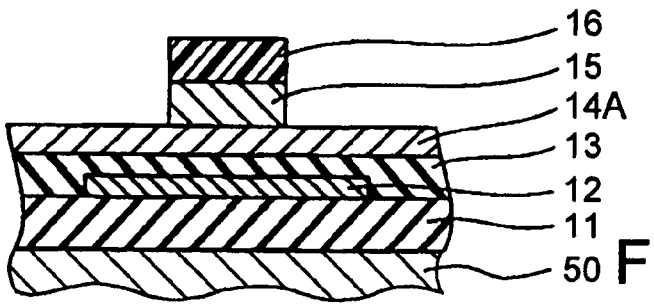
Figure 4C:
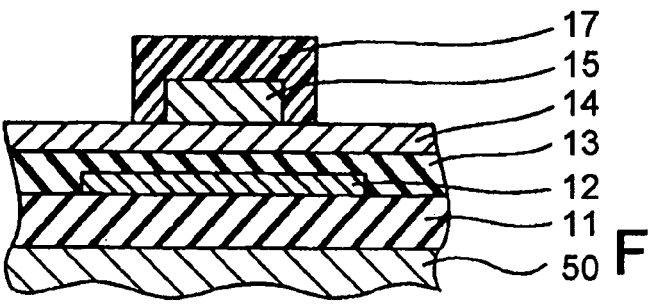

As shown in FIG. 4B, metal film 15A is patterned by etching using photoresist film 16 as a mask, thereby forming upper gate electrode 15 of the gate electrode. Photoresist film 17 is then formed on upper gate electrode 15 and microcrystalline silicon thin film 14A, as shown in FIG. 4C. Here, photoresist film 17 is provided only on a portion of microcrystalline silicon thin film 14A in such a manner that photoresist film 17 covers upper gate electrode 15. The lateral extent of photoresist film 17 from the perimeter of upper gate electrode 15 is made approximately equal to the extent of the region where LDD region 19 is to be formed.

Figure 4D:
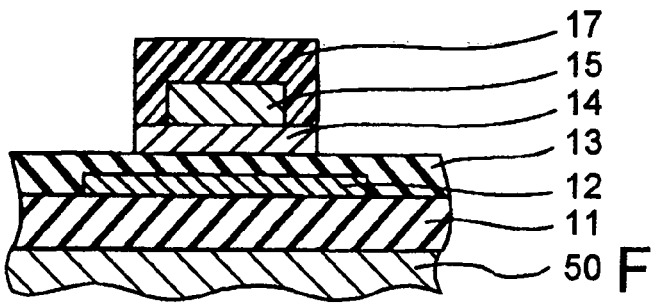
Figure 4E:
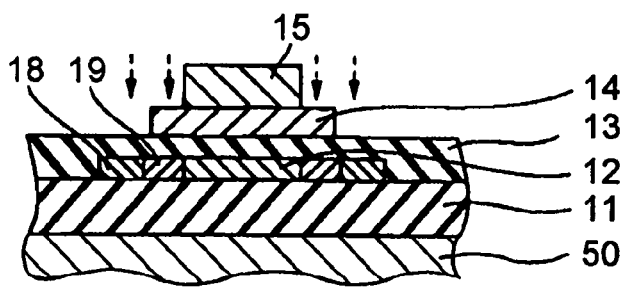

Then, as shown in FIG. 4D, photoresist film 17 is used as a mask to etch microcrystalline silicon thin film 14 to form lower gate electrode 14 made from a microcrystalline thin film larger in size than upper gate electrode 15 made of the metal film. Photoresist film 17 is removed and polysilicon thin film 12 is selectively doped with an impurity by using ion implantation or the like through gate insulating film 13, lower gate electrode 14, and upper gate electrode 15 to form source-drain region 18 and LDD region 19 concurrently, as shown in FIG. 4E. The impurity is then activated by heat treatment at 500 degree C., for example. The difference in impurity concentration between LDD region 19 and source-drain region 18 is equivalent to the concentration of the impurity blocked by lower gate electrode 14 made from the microcrystalline thin film. The impurity is prevented in effect from being introduced in polysilicon thin film 12 in the position where upper gate electrode 15 is formed because upper gate electrode 15 has a sufficient thickness.

Then, upper gate electrode 15 made of the metal film is used as a mask to etch away the exposed portion of lower gate electrode 14 made from the microcrystalline thin film. As a result, the basic structure of TFT 10 as shown FIG. 3 is completed in which the gate electrode does not exist over LDD region 19.

Although not shown, an interlayer insulating film is deposited on the entire surface, and then a contact hole is formed to expose source-drain region 18, and finally a metal thin film such as an aluminum film is formed and patterned to form a metal wiring that comes in contact with source-drain region 18 to complete the manufacturing process of TFT 10.

In this way, top-gate TFT 10 can be fabricated that has a channel region made of polysilicon thin film 12, source-drain region 18 and LDD region 19 which are provided on each of both sides of the channel region, and a two-layer gate electrode provided on gate insulating film 13 over the portion between LDD regions 19.

In TFT 10 of the first embodiment, the gate electrode has a two-layer structure consisting of lower gate electrode 14 made from a microcrystalline silicon thin film and upper gate electrode 15 made from a metal film. Accordingly, the metal film of upper gate electrode 15 can be used as a mask to etch an exposed portion of the microcrystalline silicon thin film of lower gate electrode 14 to shape lower gate electrode 14 into the same plane shape as that of upper gate electrode 15. Shaping lower gate electrode 14 into the same plane shape as that of upper gate electrode 15 after forming LDD region 19 by ion implantation or the like enables fabrication of an LDD-TFT in which lower gate electrode 14 does not exist over LDD region 19, because the impurity is not introduced in the region in polysilicon thin film 12 beneath upper gate electrode 15.

In this way, according to the first embodiment, an LDD-TFT with minimized leakage current can be manufactured at a low cost without increasing the number of fabrication processes. The reason why leakage current is minimized is that LDD region 19 is not overlapped by the lower gate electrode and therefore the electric field applied from the gate electrode to the LDD region is weak compared with the case where the gate electrode exists over the LDD region.

An LDD-TFT according to a second embodiment of the present invention will be described next. The LDD-TFT according to the second embodiment is the same in structure as the LDD-TFT according to the first embodiment shown in FIG. 3 but differs in manufacturing process. The manufacturing process of the LDD-TFT according to the second embodiment will be described with reference to FIGS. 5A to 5E, which illustrate the manufacturing process sequence step by step.

Figure 5A:
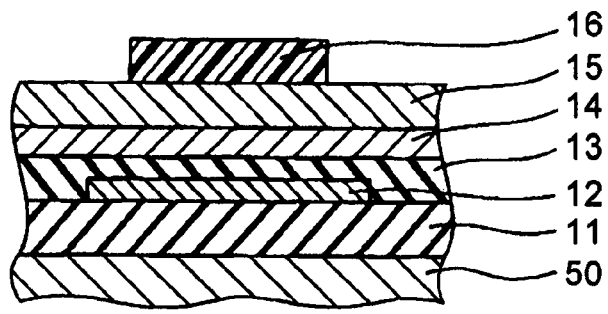
FIGS. 5A to 5E are cross-sectional views showing a sequence of manufacturing process of a TFT according to a second embodiment of the present invention.

As shown in FIG. 5A, underlying insulating film 11, polysilicon thin film 12, gate insulating film 13, microcrystalline silicon thin film 14A, and metal film 15A are deposited on insulating substrate 50 in this order, and photoresist film 16 is formed on metal film 15A and patterned as in the first embodiment. The geometry of patterned photoresist film 16 in the first embodiment corresponds to that of upper gate electrode 15, whereas the geometry of photoresist film 16 in the second embodiment corresponds to the geometry of a region of the combination of lower gate electrode 14 and LDD region 19 in the completed TFT.

Figure 5B:
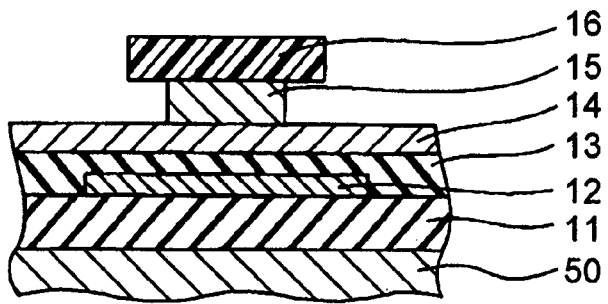
Figure 5C:
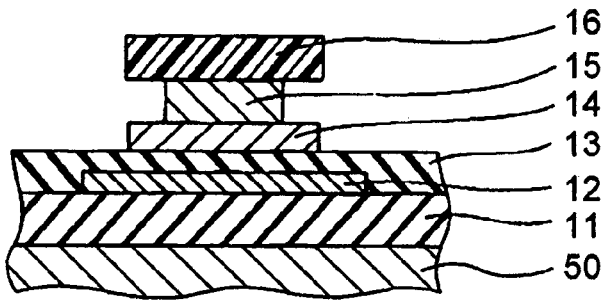

Then, as shown in FIG. 5B, photoresist film 16 is used as a mask to etch only metal film 15A. In this etching process, metal film 15A is over-etched so that a portion of metal film 15A that is beneath photoresist film 16 is partly removed. Thereafter, the same photoresist film 16 is used as a mask to etch microcrystalline silicon thin film 14A, as shown in FIG. 5C. As a result, a two-layer gate electrode is formed in which lower gate electrode 14 made from the microcrystal silicon thin film protrudes beyond the perimeter of upper gate electrode 15 made from the metal film, in other words, upper gate electrode 15 and lower gate electrode 14 have different lateral widths.

Figure 5D:
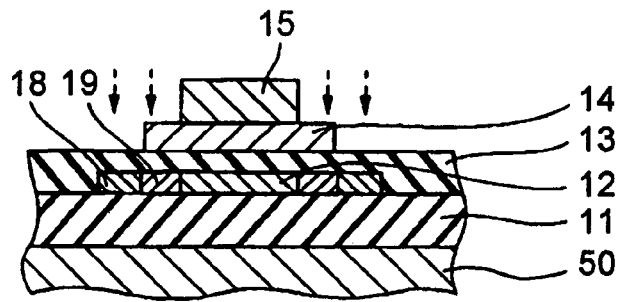

Then, as shown in FIG. 5D, photoresist film 16 on the gate electrode is removed and polysilicon thin film 12 is selectively doped with an impurity by using ion implantation or the like through gate insulting film 13, lower gate electrode 14, and upper gate electrode 15. The impurity passes through the portion of the microcrystalline silicon thin film that is not covered by upper gate electrode 15. Consequently, the concentration of the impurity in the portion of polysilicon thin film 12 beneath that uncovered portion of the microcrystalline silicon thin film decreases and that portion becomes LDD region 19. On the other hand, the portion of polysilicon thin film 12 that does not cover the microcrystalline silicon thin film becomes heavily doped source-drain region 18 because the impurity is not blocked by the microcrystalline silicon thin film. In this way, source-drain region 18 and LDD region 19 are formed concurrently according to the second embodiment.

Figure 5E:
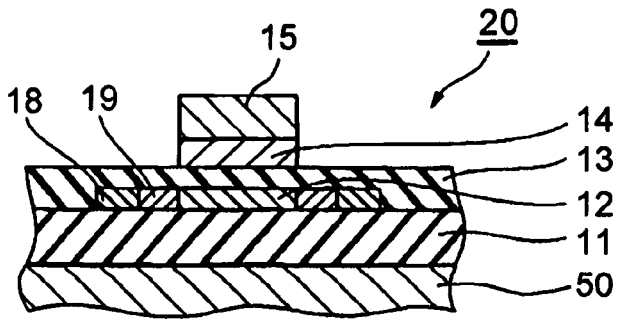

The process after impurity activation is the same as the first embodiment. As a result, in the second embodiment, the basic structure of TFT 20 is completed as shown in FIG. 5E. Thereafter, an interlayer insulting film and metal wiring are provided as in the first embodiment.

The second embodiment provides the same advantageous effects as those of the first embodiment described above. In addition, according to the second embodiment, an LDD-TFT with minimum leakage current can be fabricated with fewer processes than the first embodiment because a gate electrode consisting of a lower layer having a relatively wide profile and an upper layer having a relatively narrow profile can be formed in a single photoresist process.

While LDD region 19 is provided on both of the source and drain sides of the channel region formed beneath the gate electrode in the first and second embodiments, the LDD region may be provided only on the drain side according to the present invention. In that case, only a source-drain region with a relatively high impurity concentration will be formed on the source side in the polysilicon thin film.

According to the present invention, while the gate electrode in the embodiments described above has a two-layer structure consisting of lower gate electrode 14 made from a microcrystalline silicon thin film and upper gate electrode 15 made from a metal film, a gate electrode consisting of a lower layer having a wider profile and an upper layer having a narrower profile may be formed by processing a single-layer film made from the same material. Furthermore, the lower gate electrode itself may be formed with a multilayer film, and the upper gate electrode itself may be formed with a multilayer film. The order in which the upper and lower gate electrodes are formed is not limited to the order described above. The lower gate electrode may be patterned first and then the upper gate electrode may be patterned.

Figure 6:
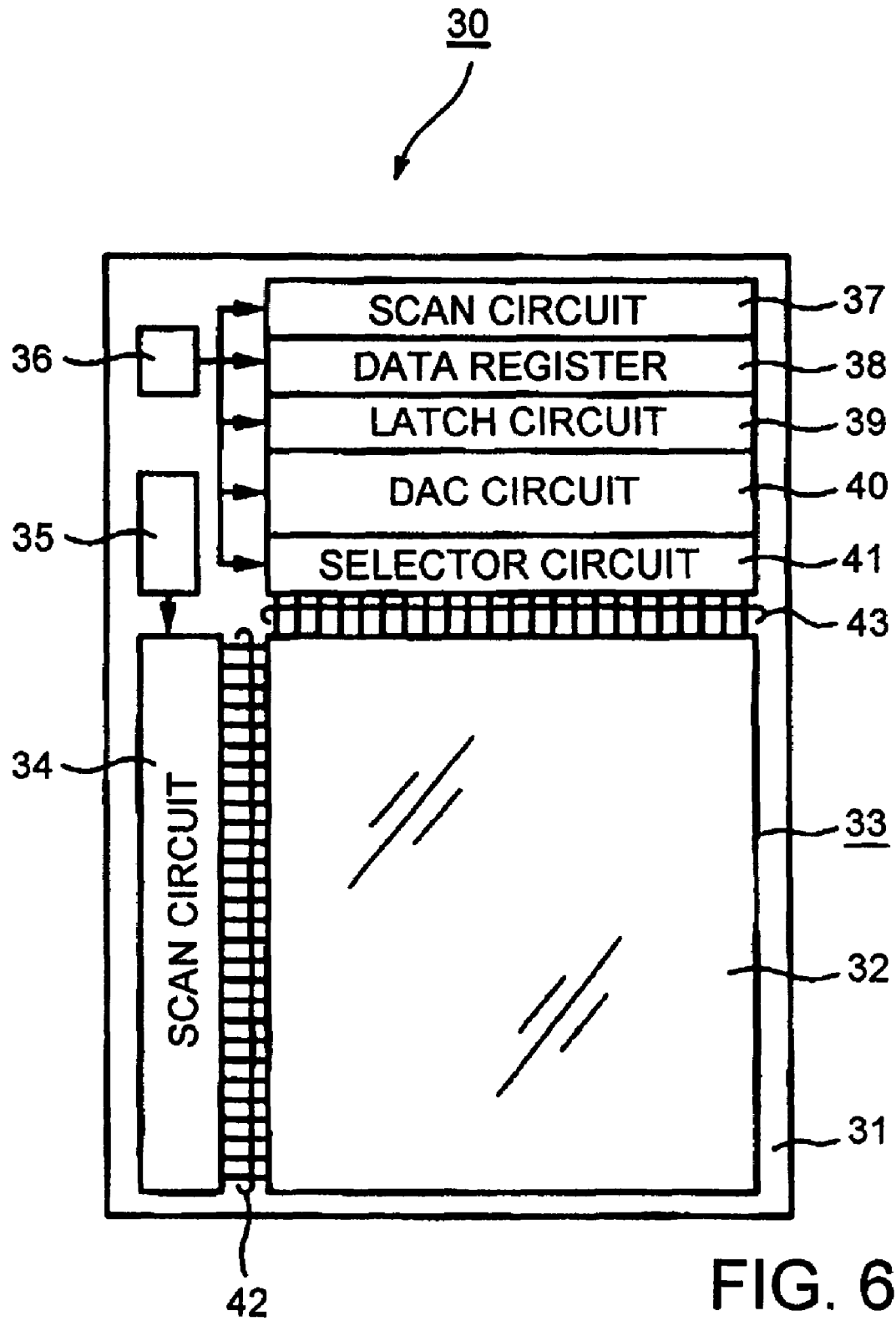
FIG. 6 is a plan view of an exemplary configuration of an LCD in which TFTs according to the present invention are provided.

FIG. 6 shows an exemplary configuration of an LCD including LDD-TFTs according to the present invention. LCD 30 shown includes insulating substrate 31 on which TFTs according to the first or second embodiment are formed, counter substrate 32 paired with insulating substrate 31, display portion 33 including multiple liquid-crystal elements (not shown) sandwiched between insulating substrate 31 and counter substrate 32, and circuits such as driving circuits (such as scan circuit 34) for driving the liquid-crystal elements through the TFTs. The circuits provided include scan circuits 34, 37, level shifter/timing buffer 35, level shifter 36, data register 38, latch circuit 39, DAC (digital-to-analog converting) circuit 40, selector circuit 41 and the like. Details of a configuration of the driving circuits used are well-known to those skilled in the art and are disclosed, for example, in Japanese Patent Laid-Open Application No. 2004-46054 (JP, A, 2004-046054).

Display portion 33 includes a matrix of gate lines 42 and data lines 43, TFTs each of which provided at an intersection of gate line 42 and data line 43, and liquid-crystal elements connected to the TFTs. Display portion 33 is configured as an active-matrix display. The TFTs constituting the circuits such as driving circuits are polysilicon LDD-TFTs formed on insulating substrate 31 at the same time as the formation of other TFTs (i.e., pixel transistors) each of which is associated with each individual liquid-crystal pixel in display portion 33.

LCD 30 is low-cost and yet capable of displaying a high-quality image because it has display portion 33 formed with LDD-TFTs according to any of the embodiments described above. This is because the TFTs according to the present invention can achieve low leakage current amounts and therefore allow a high contrast ratio of the LCD to be set and can reduce color nonuniformity, thus providing a high-quality picture even though they are manufactured with fewer processes. Furthermore, by using LDD-TFTs according to the present invention in driving circuits, malfunctions of the circuits can be prevented and the power consumption in the circuits can be reduced because leakage current is minimized.

EXAMPLES

The present invention will be described in further detail with respect to results of evaluation of characteristics of an actual top-gate LDD-TFT manufactured.

Example 1

An LDD-TFT was manufactured according to the first embodiment. As insulating substrate 50 was used as a low-temperature glass, "OA-2 substrate" from Nippon Electric Glass Co., Ltd. A silicon dioxide thin film was deposited to a thickness of 300 nm on the low-temperature glass substrate as underlying insulating film 11 by using plasma CVD using a mixed gas of $SiH_4$ and $N_2O$ as a raw-material gas. Then, an amorphous silicon thin film was deposited to a film thickness of 60 nm on underlying insulating film 11 by a reduced pressure CVD method using $Si_2H_6$ as a raw-material gas. The deposition was performed at a $Si_2H_6$ flow rate of 200 sccm under a pressure of 13 Pa at a substrate temperature of 450 degree C. for 50 minutes. After that, laser annealing was performed in which the amorphous silicon thin film was irradiated with a XeCl excimer laser beam with a wavelength of 308 nm to crystallize the amorphous silicon thin film, thereby forming a polysilicon thin film. The amorphous silicon thin film was scanned and irradiated with the excimer laser beam with an energy density of 396 mJ/cm$^2$ and an overlap rate of 90%. Polysilicon thin film 12 was then patterned using an ordinary photoresist process and was etched using dry etching to shape polysilicon thin film 12 into an island.

A silicon dioxide thin film was deposited to a thickness of 12 nm on island-shaped polysilicon thin film 12 by plasma CVD using $SiH_4$ and $O_2$ as a raw-material gas. The flow rates of $SiH_4$ and $O_2$ were 185 sccm and 3,500 sccm, respectively, and the flow rate of He used as a diluting gas was 100 sccm. The deposition was conducted under a pressure of 125 Pa, at a substrate temperature of 410° C. with a discharge electric power of 0.33 W/cm$^2$ for 70 seconds.

Then, microcrystalline silicon thin film 14A, eventually to be formed as lower gate electrode 14, was deposited to a thickness of 100 nm by plasma CVD using a mixed gas of $SiH_4$, $PH_3$ (5% $H_2$ dilution) and $H_2$. The flow rates of $SiH_4$, $PH_3$ (5% $H_2$ dilution), and $H_2$ were 20 sccm, 65 sccm, and 2,500 sccm, respectively. The deposition was conducted under a pressure of 260 Pa with a discharge power density of 1.37 W/cm$^2$ at a substrate temperature of 390° C. for 4 minutes. The resistivity of the formed microcrystalline silicon thin film significantly depends on its thickness. This is because the growth rate of crystal components in the microcrystalline silicon increases as the thickness of the film increases. It is desirable that the resistivity of the film be less than or equal to 1 Ω·cm in consideration of using the film as a lower gate electrode. Accordingly, the microcrystalline silicon thin film should be at least 70 nm thick. A high temperature of the substrate is also desirable because the growth rate of crystalline components increases with the rise of temperature of the substrate. However, too high temperature of the substrate decreases the process throughput and increases both device and process costs. The temperature of the substrate is preferably up to 350° C., which is practicable in a typical plasma CVD apparatus.

Then, spattering was performed to deposit a chromium (Cr) thin film to a thickness of 200 nm as metal film 15A from which upper gate electrode 15 would be formed. The deposition was performed using Ar as a spattering gas at a flow rate of 100 sccm under a pressure of 0.3 Pa with a discharge power density of 2 W/cm$^2$ at a substrate temperature of 150° C. for 0.23 minutes. The resistivity of the formed chromium thin film was $9 \times 10^{-3}$ Ω·cm. An ordinary photoresist process was performed to pattern photoresist film 16 used for forming upper gate electrode 15. Photoresist 16 was then used as a mask to etch the chromium thin film by dry etching with a mixed gas of $Cl_2$, $O_2$, and He as an etching gas to form upper gate electrode 15. The etching was performed with $Cl_2$, $O_2$, and $H_3$ flow rates of 250 sccm, 150 sccm, and 150 sccm, respectively, under a pressure of 40 Pa with a discharge power density of 1.3 W/cm$^2$ for 5 minutes.

After upper gate electrode 15 was formed by the etching of the chromium thin film, photoresist film 17 for forming lower gate electrode 14 was provided and patterned. Photoresist film 17 was then used as a mask to dry-etch microcrystalline silicon thin film 14A using $Cl_2$ and $CF_4$ as an etching gas. The etching was performed with $Cl_2$ and $CF_4$ flow rates of 100 sccm and 40 sccm, respectively, under a pressure of 3 Pa with a discharge power density of 0.48 W/cm$^2$. After an etch end point was detected, the etching was continued for 6 minutes.

After microcrystalline silicon thin film 14A was thus etched, photoresist film 17 on the gate electrode was removed and an impurity was introduced into polysilicon thin film 12 in a self-aligning manner by using ion implantation with boron ions ($B^+$) using the gate electrode as a mask. This doping was performed under an acceleration voltage of 70 KeV and a pressure of 0.02 Pa with a dose of $2.2 \times 10^{14}$ cm$^{-2}$.

Figure 7:
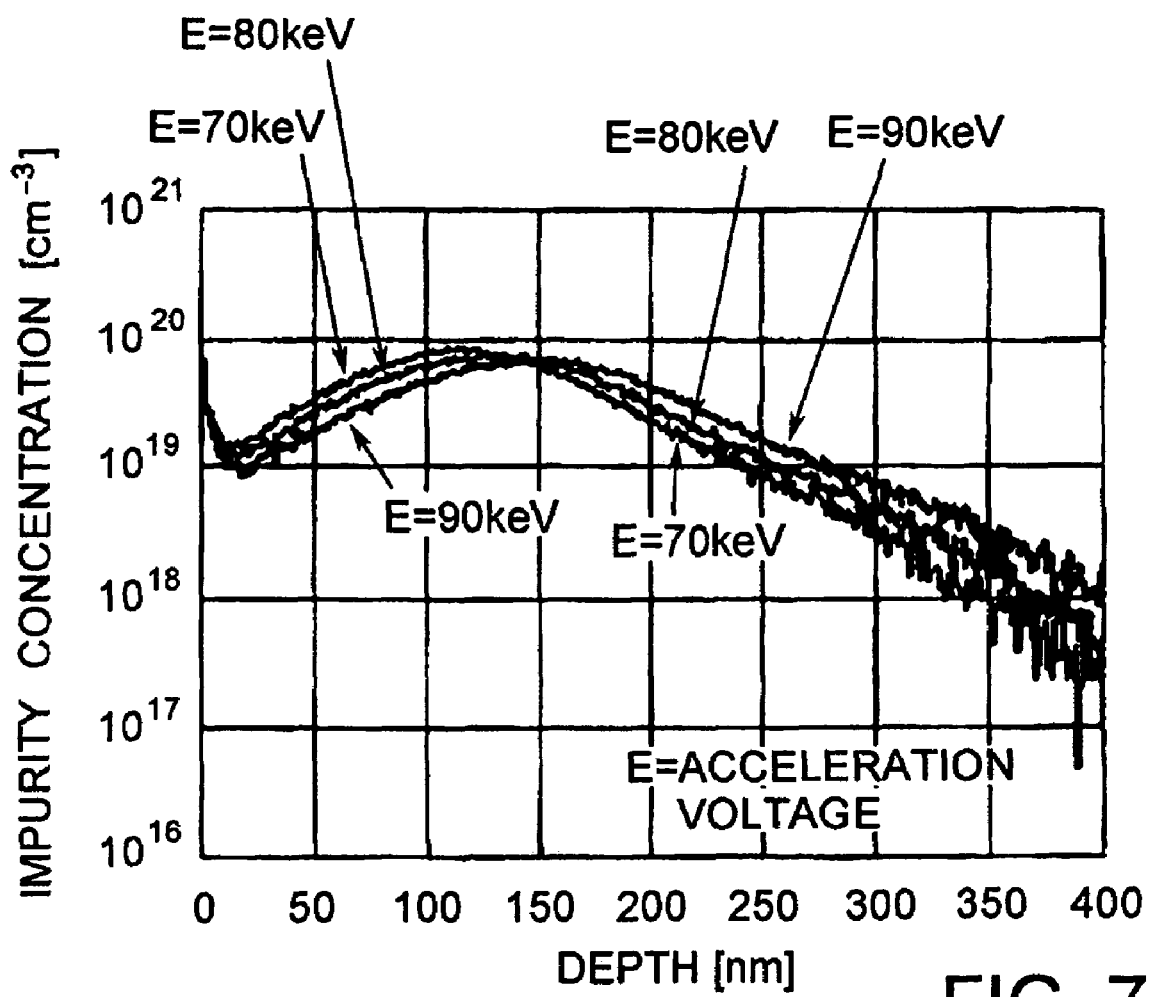
FIG. 7 is a graph of the concentration profile of boron in a silicon layer.

The graph in FIG. 7 will be described. FIG. 7 shows a concentration profile of boron in a silicon layer doped with boron ions ($B^+$) by ion implantation from the surface of the silicon layer. The horizontal axis represents the depth from the surface of the silicon layer and the vertical axis represents the concentration of the impurity (i.e., boron). In the concentration profile of the implanted boron, the differences among any silicon materials can be ignored, whatever their types such as polysilicon, microcrystalline silicon, or silicon oxide. It can be seen from the graph of FIG. 7 that the impurity concentration in the heavily doped region (i.e., source-drain region 18) in polysilicon thin film 12 in this example is a value at a depth of 120 nm, which is equivalent to the thickness of the silicon dioxide thin film, 120 nm, used as gate insulating film 13. On the other hand, the impurity concentration in the lightly doped region (LDD region 19) is a value at a depth of 220 nm in FIG. 7, which is equivalent to the thickness of the layer stack of the 120 nm thick silicon dioxide thin film used as gate insulating film 13 and the 100 nm thick microcrystalline silicon thin film forming lower gate electrode 14. The concentration of boron in LDD region 19 was an order of magnitude lower than the concentration in source-drain region 18 because of the influence of the presence of the 100 nm thick lower gate electrode.

FIG. 7 also shows the concentration profile of boron ions at acceleration voltages of 80 keV and 90 keV. It can be seen that the peak of the impurity concentration shifts to a deeper position in the silicon layer as the acceleration voltage increases. Furthermore, the depth at which the concentration of boron reaches the maximum is approximately 120 nm for an acceleration voltage of 70 keV, approximately 135 nm for 80 keV, and approximately 155 nm for 90 keV. The depth at which the decrease in boron concentration becomes somewhat gradual, that is, the depth at which the boron concentration changes from $1\times10^{19}$ cm$^{-3}$ to $1\times10^{18}$ cm$^{-3}$ is approximately 100 nm for an acceleration voltage of 70 keV, approximately 120 nm for 80 keV, and approximately 130 nm for 90 keV.

After the ion implantation was performed as described above, an exposed portion of lower gate electrode 14, that is, a portion of the microcrystalline silicon thin film that was not covered by upper gate electrode 15, was etched away by using a mixed gas of Cl$_2$ and CF$_4$ as an etching gas. The etching was performed with a Cl$_2$ flow rate of 100 sccm, a CF$_4$ flow rate of 40 sccm under a pressure of 3 Pa with a discharge power density of 0.29 W/cm$^2$.

Then, a silicon oxide film was deposited to a thickness of 100 nm on the entire surface by plasma CVD using a raw-material gas which is a mixed gas of SiH$_4$, PH$_3$ (5% H$_2$ dilution), and H$_2$. Annealing was applied in order to activate the impurity in polysilicon thin film 12. A silicon oxide thin film was then deposited to a thickness of 300 nm on the entire surface by again plasma CVD using a mixed gas of SiH$_4$, PH$_3$ (5% H$_2$ dilution), and H$_2$ as a raw-material gas. A contact hole was formed by dry etching, an aluminum film was deposited to a thickness of 500 nm by using spattering, and was patterned to form a metal wiring. Finally, annealing was performed to complete the TFT.

LDD-TFTs manufactured in this way can be manufactured at a lower process temperature, higher throughput, and lower cost than conventional TFTs, and the gate electrodes are more reliable. In addition, increases in leakage current are inhibited in the TFTs according to this example because the lower gate electrode does not overlap the LDD region.

Figure 1A:
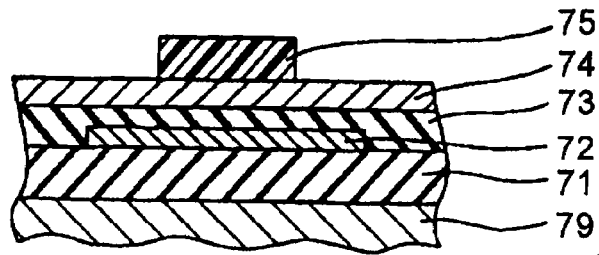
FIGS. 1A to 1E are cross-sectional views showing a sequence of manufacturing process of a conventional LDD-TFT step by step.
Figure 1B:
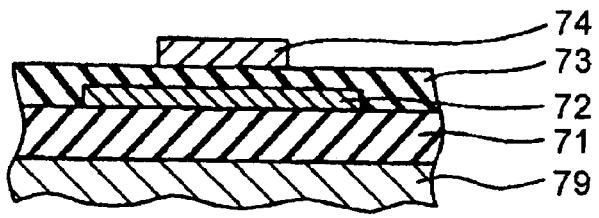
Figure 1C:
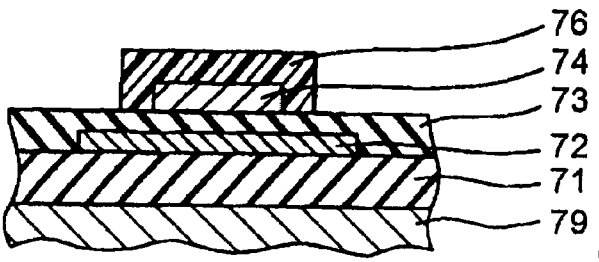
Figure 1D:
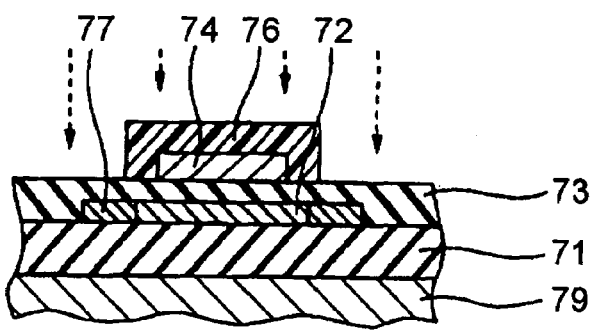
Figure 1E:
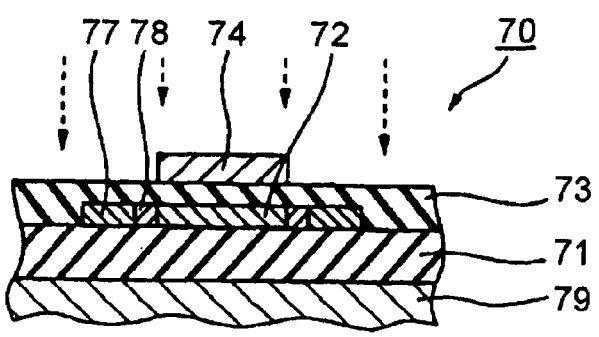
Figure 2:
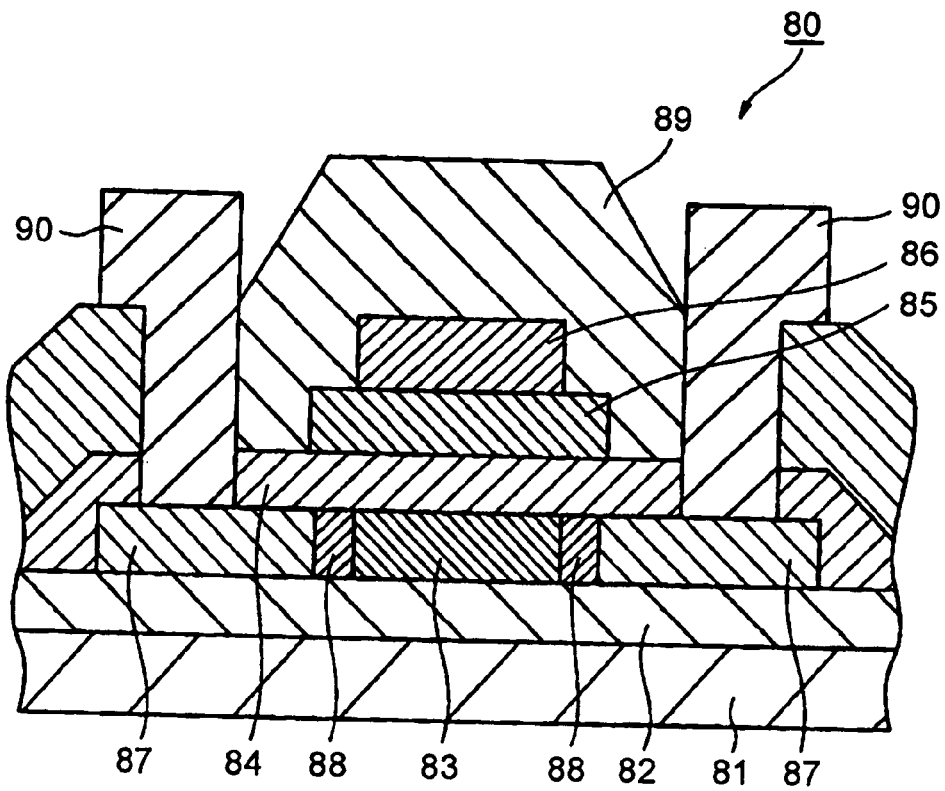
FIG. 2 is a cross-sectional view of a conventional overlapped LDD-TFT.
Figure 8:
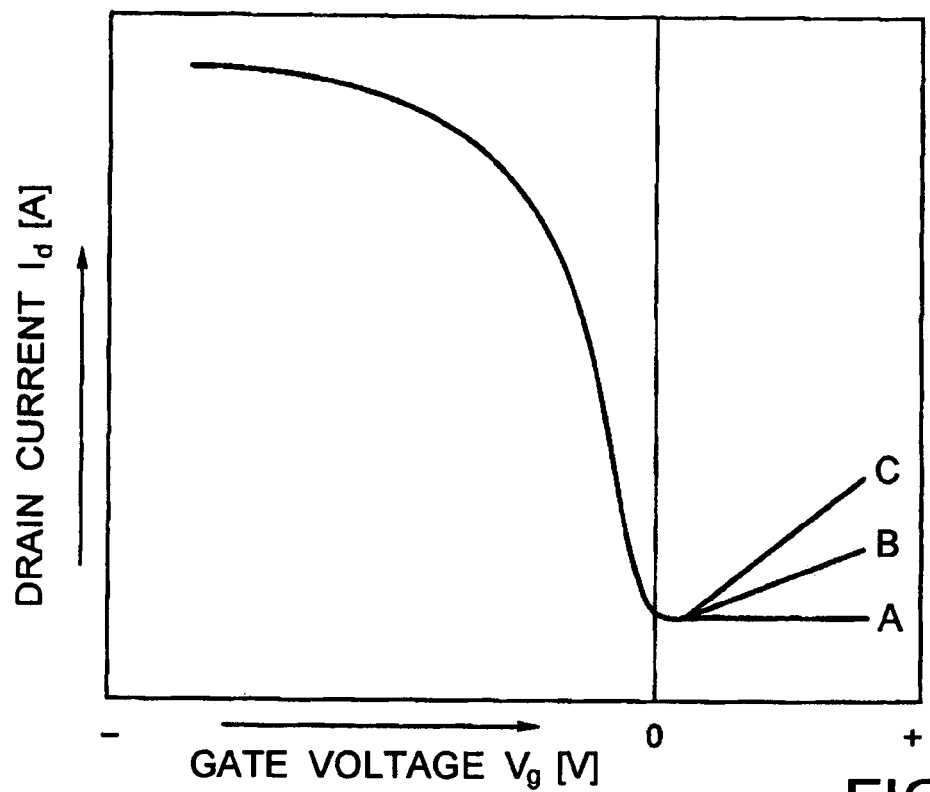
FIG. 8 is a graph of gate voltage $V_g$ versus drain current $I_d$.
Figure 9:
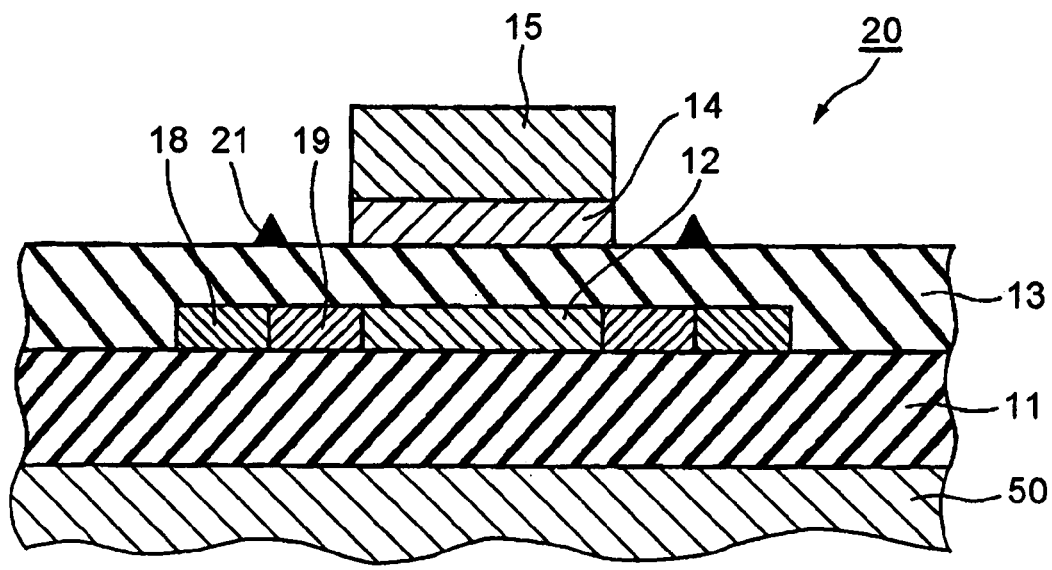
FIG. 9 is a cross-sectional view of a TFT fabricated by using dry etching instead of wet etching, according to Example 2.

FIG. 8 shows gate voltage ($V_g$) versus drain current ($I_d$) characteristic of a TFT manufactured according to this example and TFTs manufactured using conventional methods. In FIG. 8, curve A represents the $V_g$-$I_d$ characteristic of the TFT (with a 120 nm thick gate oxide film) of the present example, curve B represents the $V_g$-$I_d$ characteristic of an overlapped LDD-TFT described in JP, A, 11-307777, and curve C represents the $V_g$-$I_d$ characteristic of a conventional top-gate LDD-TFT shown in FIG. 1E. As shown, leakage current in the TFT of the present example (curve A) is significantly reduced compared with the conventional overlapped LDD-TFT (curve B) and the conventional top-gate LDD-TFT (curve C). In other words, according to the present invention, a top-gate LDD-TFT having the effect of reducing leakage current can be fabricated using a process with fewer masks.

The silicon dioxide thin film used as a gate insulating film in the LDD-TFT according to the example described above has a thickness of 120 nm. An LDD-TFT having a 100 nm thick silicon dioxide thin film as a gate insulting film and an LDD-TFT having an 80 nm thick silicon dioxide thin film were also fabricated by using the procedure of the example. The LDD-TFTs having the 100 nm and 80 nm thick gate oxide films also provided the same effects as that of the LDD-TFT having the 120 nm thick gate oxide film.

Example 2

An LDD-TFT was manufactured according to the second embodiment.

As in Example 1, polysilicon thin film 12 was formed on a low-temperature glass substrate and was patterned into an island, and gate insulating film 13, microcrystalline silicon thin film 14A, and chromium thin film 15A were deposited.

Then, a gate electrode was patterned as in Example 1. However, upper gate electrode 15 was overetched by using wet etching. The etchant used was an aqueous solution of diammonium cerium (IV) nitrate (Ce(NH$_4$)$_2$(NO$_3$)$_6$) and perchloric acid at room temperature and the etching was performed for 210 seconds. Photoresist film 16 used in the previous process was left and used to dry-etch lower gate electrode 14 under the same conditions used in Example 1. As a result, upper gate electrode 15 became narrower in width than lower gate electrode 14 by 1 μm on each side.

In this example, the amount of side-etching of the upper gate electrode was able to be increased by wet etching compared with the case where dry etching was used. Thus, sufficiently large LDD region 19 was able to be formed. It should be noted that two wet etchings may be performed and an etchant with a concentration half as high as that used in the first etching may be used in the second etching, thereby improving the etching precision.

As in Example 1, an impurity, boron, was then introduced in polysilicon thin film 12 by ion implantation. The impurity was introduced in the region in polysilicon thin film 12 that were not overlapped by the gate electrode only through gate insulating film 13 and the dose was $2.2\times10^{14}$ cm$^{-2}$ as in Example 1. On the other hand, the dose in the region of polysilicon thin film 12 beneath the portion where upper gate electrode 15 was sandwiched and lower gate electrode 14 was exposed was $3.3\times10^{13}$ cm$^{-2}$. As shown in FIG. 7, the boron concentration was reduced by an order of magnitude under the influence of 100 nm thick lower gate electrode 14.

The process for etching the exposed portion of lower gate electrode 14 and the subsequent processes were performed in the same manner that used in Example 1, thereby completing an LDD-TFT. LDD-TFTs manufactured in this way can be manufactured at a lower process temperature with a smaller number of times of introductions of impurity and fewer masks with higher throughput and lower costs than conventional TFTs. In addition, leakage current derived from the gate electrode in the LDD-TFT was small.

When the gate electrode formation process was performed using dry etching instead of wet etching in Example 2, residues 21 of the derivative of the which were resulted from contact of an etching gas with the surface of an lower gate electrode were left after the exposed portion of the lower gate electrode was etched. Residues 21 were an oxide of microcrystalline silicon exposed microcrystalline silicone thin film or were produced during impurity doping. If such residues 21 are left, their capacitive components can cause variations in TFT characteristics or cause damage to wiring formed on the residues. In order to prevent generation of such residues 21 and since dry etching cannot provide a sufficient amount of side-etching, it is preferable that wet etching be used for etching the upper gate electrode as in Example 2 if LDD-TFTs are manufactured according to the second embodiment.

While preferred embodiments and examples of the present invention have been described, the present invention is not limited to these embodiments and examples, of course. In the examples described above, amorphous silicon is used as the initial material and laser annealing is applied to form a non-single-crystal silicon thin film to be used as channel, LDD, and source-drain regions. However, the same advantageous effects as described above can be obtained by using any other type of silicon film such as a polysilicon film or microcrystalline silicon film as the initial material for forming the non-single-crystal silicon thin film. Also, instead of the silicon oxide film described above, other insulating film such as a silicon nitride film or a silicon oxynitride film can be used as the gate insulating film to obtain the same effects described above. The metal film for forming the upper gate electrode may be a film of other metal such as aluminum, tungsten silicide, molybdenum, or molybdenum silicide, or an alloy such as a tungsten-molybdenum alloy, instead of chromium given above. The same effects described above can be obtained by using any of these metals or alloys.

While boron (B) is used as the impurity introduced in the polysilicon thin film to manufacture a p-channel TFT in the examples descried above, the same effects described above can be obtained by using phosphorus as the impurity to fabricate an n-channel TFT.

While preferred embodiments of the present invention have been described using specific terms, such description is for illustrative purposes only, and it is to be understood that changes and variations may be made without departing from the spirit or scope of the following claims.

What is claimed is:

1. A method for manufacturing a thin-film transistor, comprising the steps of:
    forming a non-single-crystal semiconductor thin film on an insulating substrate;
    forming a gate insulating film on the non-single-crystal semiconductor thin film;
    forming a gate electrode including a lower gate electrode and an upper gate electrode on the gate insulating film, the lower gate electrode having a portion that is not covered by the upper gate electrode;
    forming a heavily doped region and a lightly doped region in the non-single-crystal semiconductor thin film concurrently by introducing an impurity into the non-single-crystal semiconductor thin film through the gate electrode and the gate insulating film; and
    etching away an exposed portion of the lower gate electrode by using the upper gate electrode as a mask,
    wherein the step of forming a gate electrode comprises the steps of:
        forming a conductive film including a plurality of layers on the gate insulating film; and
        forming the gate electrode by selectively etching the conductive film, wherein the step of forming a gate electrode comprises the steps of:
            forming a conductive film including a plurality of layers on the gate insulating film;
            selectively forming a photoresist film on a top layer of the conductive film; and
            forming the upper gate electrode by applying isotropic etching to the conductive film by using the photoresist film as a mask and forming the lower gate electrode by applying anisotropic etching to the conductive film by using the photoresist film as a mask.

2. The method according to claim 1, wherein the non-single-crystal semiconductor thin film is a polysilicon thin film.

3. The method according to claim 1, wherein the isotropic etching is wet etching.

4. The method according to claim 3, wherein the gate insulating film is a silicon dioxide thin film, the conductive film including the plurality of layers includes a lower, microcrystalline silicon thin film and upper, chromium thin film; and an etchant used in the wet etching is an aqueous solution of diammonium cerium (IV) nitrate and perchloric acid.

* * * * *